(12) United States Patent
Querbach et al.

(10) Patent No.: US 9,659,626 B1
(45) Date of Patent: May 23, 2017

(54) MEMORY REFRESH OPERATION WITH PAGE OPEN

(71) Applicant: Intel Corporation, Santa Clara, CA (US)

(72) Inventors: Bruce Querbach, Beaverton, OR (US); Kuljit S. Bains, Olympia, WA (US); John B. Halbert, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/998,091

(22) Filed: Dec. 26, 2015

(51) Int. Cl.
| | |
|---|---|
| *G11C 7/00* | (2006.01) |
| *G11C 11/406* | (2006.01) |
| *G11C 11/4094* | (2006.01) |
| *G11C 11/4074* | (2006.01) |
| *G11C 11/4096* | (2006.01) |

(52) U.S. Cl.
CPC .... *G11C 11/40618* (2013.01); *G11C 11/4074* (2013.01); *G11C 11/4094* (2013.01); *G11C 11/4096* (2013.01)

(58) Field of Classification Search
CPC ....................................................... G11C 7/00
USPC ....................................................... 365/203
See application file for complete search history.

(56) References Cited

U.S. PATENT DOCUMENTS

| | | | |
|---|---|---|---|
| 6,463,001 B1 * | 10/2002 | Williams | G06F 13/1636 365/189.12 |
| 6,667,927 B2 | 12/2003 | Jones, Jr. | |
| 6,681,293 B1 * | 1/2004 | Solomon | G06F 12/0811 711/120 |
| 8,867,294 B2 | 10/2014 | Kajigaya | |
| 8,982,654 B2 | 3/2015 | Dong et al. | |
| 2014/0192583 A1 * | 7/2014 | Rajan | G11C 7/10 365/63 |
| 2015/0016203 A1 | 1/2015 | Sriramagiri et al. | |

OTHER PUBLICATIONS

International Search Results and Written Opinion for PCT Application No. PCT/US2016/056638 mailed Jan. 20, 2017, 14 pages.

* cited by examiner

*Primary Examiner* — Harry W Byrne
(74) *Attorney, Agent, or Firm* — Blakely, Sokoloff, Taylor & Zafman LLP

(57) ABSTRACT

Embodiments are generally directed to memory refresh operation with page open. An embodiment of a memory device includes a memory array including a plurality of memory banks; and a control logic to provide control operations for the memory device including a page open refresh mode, wherein the control logic is to perform a refresh cycle in response to a refresh command with a memory page of the memory array open, the refresh operation including precharge of one or more memory banks of the plurality of memory banks, refresh of the one or more memory banks, and activation of the memory page.

7 Claims, 4 Drawing Sheets

MEMORY REFRESH OPERATION WITH PAGE OPEN

TECHNICAL FIELD

Embodiments described herein generally relate to the field of electronic devices and, more particularly, to memory refresh operation with page open.

BACKGROUND

Refreshing of memory such as dynamic random access memory (DRAM) continues to require a large percentage of the bandwidth of the memory.

DRAM requires regular refreshing of the contents of the memory to prevent data loss, with the frequency of the needed refresh cycles varying with factors such as the temperature of the memory.

BRIEF DESCRIPTION OF THE DRAWINGS

Embodiments described here are illustrated by way of example, and not by way of limitation, in the figures of the accompanying drawings in which like reference numerals refer to similar elements.

DETAILED DESCRIPTION

Figure 1:
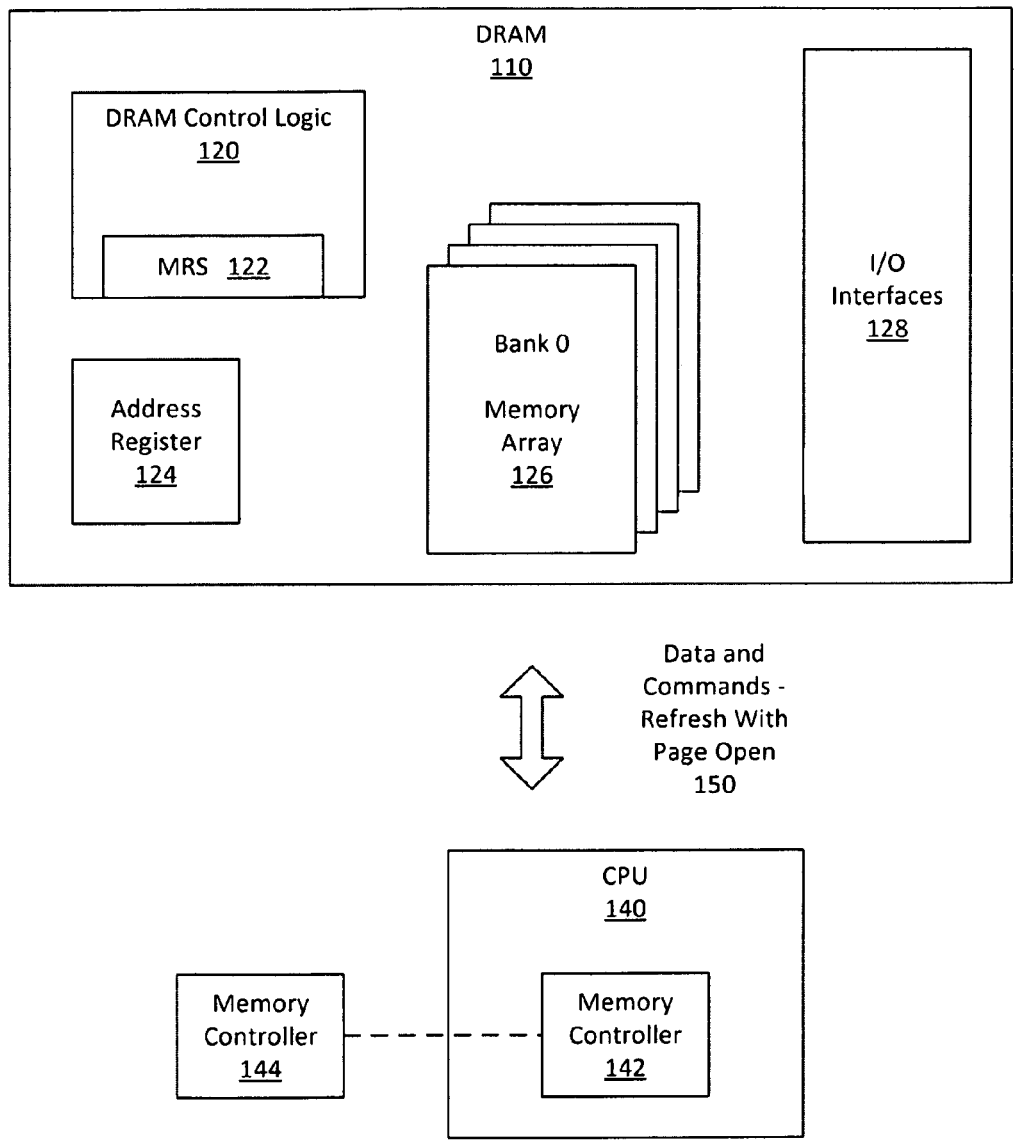
FIG. 1 is an illustration of a memory device providing page open refresh according to an embodiment.

Embodiments described herein are generally directed to memory refresh operation with page open.

For the purposes of this description:

"Dynamic random access memory" or "DRAM" refers to at least a type of physical random access memory (RAM) used for storing bits of data in computing devices, wherein each bit of data is stored in an memory element including a capacitor that must be refreshed (reenergized) to avoid losing the contents of the DRAM. DRAM may include, but is not limited to, memory contained in modules such as DIMMs (Dual In-Line Memory Modules). The memory device or DRAM can refer to a memory die itself and/or to a packaged memory product.

DRAM may include DDR (Double Data Rate) technology, where DDR SDRAM (synchronous DRAM) is organized is organized in rows, which are referred to as memory pages (which may generally be referred to herein as pages). Further, the memory pages are divided into sections referred to as banks, with each bank having a register associated with it. If a memory bank is active, there is then an open page associated with the register of the memory bank.

A memory as described herein may be compatible with a number of memory technologies, such as DDR4 (DDR version 4, initial specification published in September 2012 by JEDEC), LPDDR4 (LOW POWER DOUBLE DATA RATE (LPDDR) version 4, JESD209-4, originally published by JEDEC in August 2014), WIO2 (Wide I/O 2 (WideIO2), JESD229-2, originally published by JEDEC in August 2014), HBM (HIGH BANDWIDTH MEMORY DRAM, JESD235, originally published by JEDEC in October 2013), DDR5 (DDR version 5, currently in discussion by JEDEC), LPDDR5 (LPDDR version 5, currently in discussion by JEDEC), HBM2 (HBM version 2, currently in discussion by JEDEC), and/or others, and technologies based on derivatives or extensions of such specifications.

"Mobile electronic device" or "mobile device" refers to at least a smartphone, smartwatch, tablet computer, notebook or laptop computer, handheld computer, mobile Internet device, wearable technology, or other mobile electronic device that includes processing capability.

The trend for increasing refresh rates is expected to continue with memory advances. However, refresh requirements cause a disruption in controller paging policies as pages are required to be closed before issuance of a refresh command.

Further, refresh operation consume command bandwidth as an explicit pre-charge (PRE) command to the memory is generally needed before a refresh command, and an activate command is required to reopen any closed pages. A memory feature allowing for refresh per bank of memory can further exacerbate the command bandwidth issue as commands for each bank of memory are provided and require additional available command bandwidth.

In some embodiments, an apparatus, system, or process operations to reduce the impact of refresh operations on bandwidth by enabling refresh operation by a memory controller with one or more pages opened, thereby improving bandwidth and system performance.

In some embodiments, an apparatus, system, or process operates to reduce the impact of refresh operation on bandwidth by enabling refresh with a page open. In some embodiments, a memory controller is not required to close a current page to issue refresh. In some embodiments, a memory controller may simply issue the refresh command for a DRAM, with the DRAM being responsible for pre-charging, internal refreshes, and restoring any pages open at the time of the refresh command.

With larger capacity memory, there is need to charge capacitors to provide refresh and maintain the data stored in such larger memory. However, this process is both taking more time and being required more often, and thus is requiring increasing amounts of bandwidth, including bandwidth for explicit precharge commands that are required by the memory controller.

In a particular example, refresh operations for a 4 Gb (gigabit) memory die using DDR technology may require roughly 3.3% of the overall bandwidth as a refresh command is required to be transmitted every 7.8 microseconds (μs) (tREFI refers to refresh interval time) and each refresh command takes 260 nanoseconds (ns) (tRFC refers to refresh cycle time) to complete. (Wherein 260 ns/7.8 μs=5.38%.) With an increase in size to a 16 Gbit device, tRFC value may increase to 550 ns and refresh rate may increase to 3.9 μs, therefore requiring approximately 14.1% (550 ns/3.9 μs) of total bandwidth for the refresh operation.

In some embodiments, an apparatus, system, or process operates to enable refresh with page open by shifting operations to logic (which may also be referred to as a processing unit) of the DRAM. In some embodiments, a memory controller is not required to close a page if the page is open when there is a refresh operation, wherein the commands and operations required to perform the refresh provided by the DRAM.

In some embodiments, a page open refresh function of a memory device may be enabled or disable, wherein, upon the page open refresh function being disabled, the refresh operation is addressed in a normal fashion by which the refresh commands are provided by the memory controller for the apparatus or system. In some embodiments, a new MRS (Mode Register Set) mode register is provided in a memory to enable or disable the page open refresh function.

In some embodiments, page open refresh may be performed on a per bank basis for memory banks in addition to performance on all banks of the memory. In some embodiments, an address is specified for refresh, and the DRAM handles the processes for the specified memory bank in the refresh operation.

In some embodiments, a memory (which may be referred to as a smart memory device) includes logic operable to perform the functions for the page open refresh function. In some embodiments, if page open refresh functionality is enabled, then the DRAM will recharge all banks (or certain banks on per bank basis) prior to refresh and activate memory to re-open pages. In some embodiments, the memory is operable to wait the required time periods to allow completion of each memory refresh task.

In some embodiments, page open refresh is enabled by a shift of functionality from the CPU memory controller (wherein the memory controller may be a part of the CPU or may be a separate element) to control logic of the DRAM. In modern memory devices, the interface between the CPU memory controller and the DRAM is on an interface that is shared between multiple devices (which may be, for example, a 64-bit interface, but embodiments are not limited to any particular data widths), and thus the shifting of responsibility from the memory controller to the DRAM opens up bandwidth for other functions. Thus, both bandwidth and overall system performance may be improved by page open refresh, with the opening of bandwidth allowing the performance of other functions, thereby affecting entire system performance.

FIG. 1 is an illustration of a memory device providing page open refresh according to an embodiment. As illustrated, a DRAM memory 110 is illustrated, where the illustration is a high level illustration that does not include all elements or variants for such memory. The DRAM 110 includes a control logic 120, including a mode register set 122. In some embodiments, the mode register set 122 includes one or more registers to enable or disable a page open refresh mode. As further illustrated, the DRAM further includes an address register 124 for addressing of memory, memory arrays 126 including multiple memory banks (illustrated as four banks); and I/O (input-output) interfaces 128.

Also illustrated in FIG. 1 is a central processing unit (CPU) 140 including a memory controller 142 or operating with an external memory controller 144, wherein the memory controller 142-144 provides data and commands 150 for operation of the DRAM 110. In some embodiments, the commands include a page open refresh command to allow a refresh command without requiring supporting command bandwidth, such as providing refresh of all banks or subset of the banks of memory of the DRAM 110 without requiring a precharge command (PRE) prior to a memory refresh cycle and without requiring a activate (ACT) to reopen pages that were closed in the refresh cycle. In some embodiments, the memory controller 142-144 may operate to enable or disable the page open refresh mode through an MRS write to the mode register for the page open refresh mode in the mode register set 122.

Figure 2:
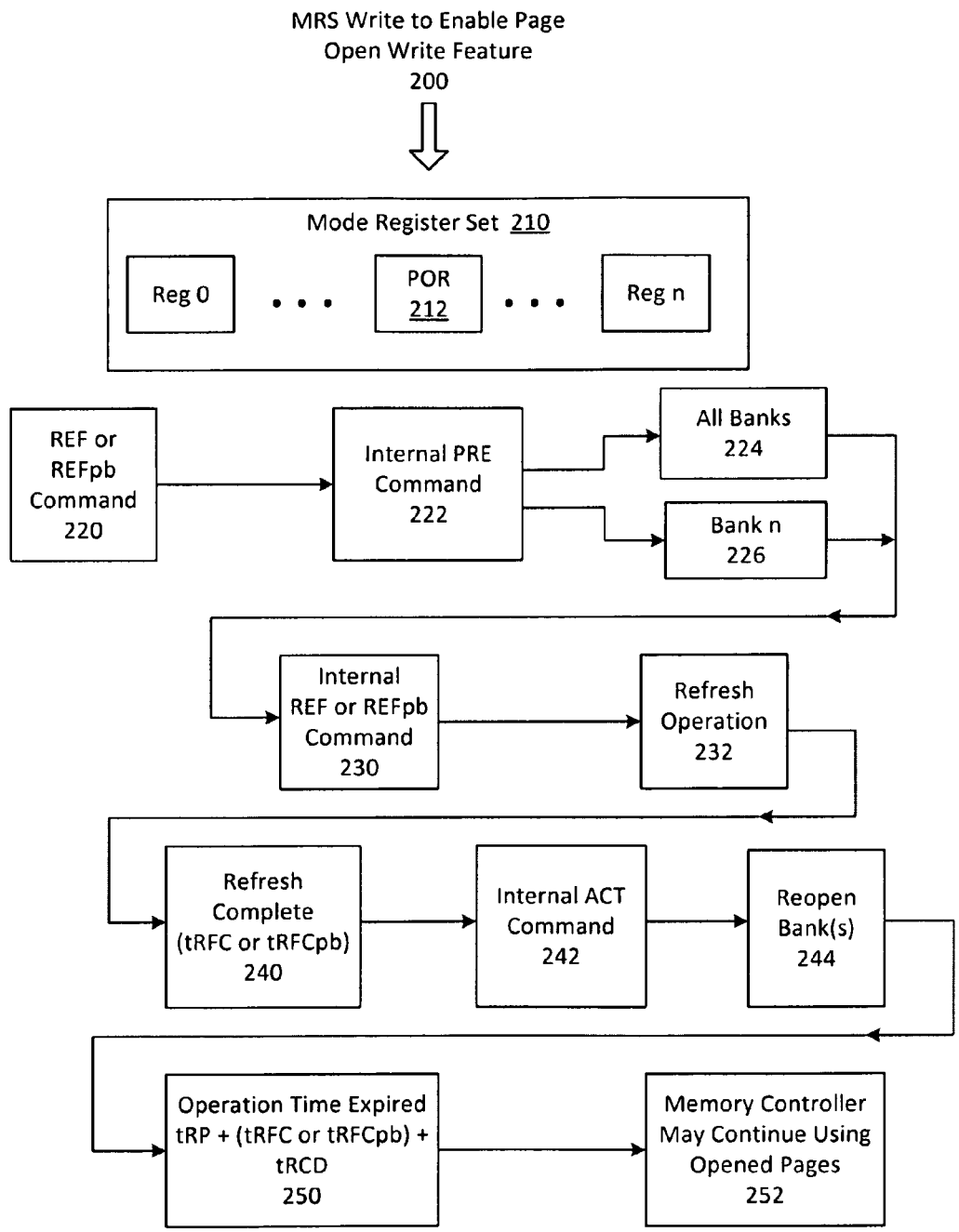
FIG. 2 is an illustration of page open refresh operations by a memory according to an embodiment.

FIG. 2 is an illustration of page open refresh operations by a memory according to an embodiment. In some embodiments, a memory controller may enable a page open refresh feature 200 through an MRS (mode register set) write 210 to program the page open refresh (POR) mode register 212 of the mode register set 210, where the POR mode register is illustrated as one of n mode registers (Reg 0 through Reg n).

In some embodiments, if the DRAM receives a refresh (REF or REFpb (per bank)) command 220 and the page open refresh feature is enabled per the POR mode register 212, then the DRAM is operable to issue an internal precharge (PRE) command 222 to precharge one or more memory banks, which may be a precharge command directed to all memory banks 224 (for an REF command) or to a specific memory bank 226 (for an REFpb command). The DRAM then proceeds to provide internal refresh commands 230 and perform the refresh operation 232. In some embodiments, an internal precharge (PRE) command can be issued to multiple memory banks, but less than all memory banks 224.

In some embodiments, after the refresh cycle is completed 240, occurring within a refresh cycle time (tRFC) or refresh cycle time per bank (tRFCpb), the DRAM issues an internal activate (ACT) command 242 to reopen the specific pages that it had closed 244. The pages may be in a specific bank for a REFpb (refresh per bank) or in one or more banks for a REF (all bank refresh) command. In this manner, the memory device provides for precharge operations prior to the refresh cycle and for activate operation of closed pages after the refresh cycle without requiring additional commands from the memory controller.

In some embodiments, after the total operation time represented by the row precharge delay time (tRP), refresh cycle time (tRFC or tRFCpb, depending on whether the refresh cycle is directed to all banks or is directed on a per bank basis), and the row command delay time (tRCD) has expired, the total time being tRP+(tRFC or tRFCpb)+tRCD 250, the memory controller is able to then continue using the opened pages 252. At least some of the bandwidth available for commands from the memory controller of the memory may be freed during the total operation time because the memory controller does not issue precharge, refresh, and/or activate commands.

Figure 3:
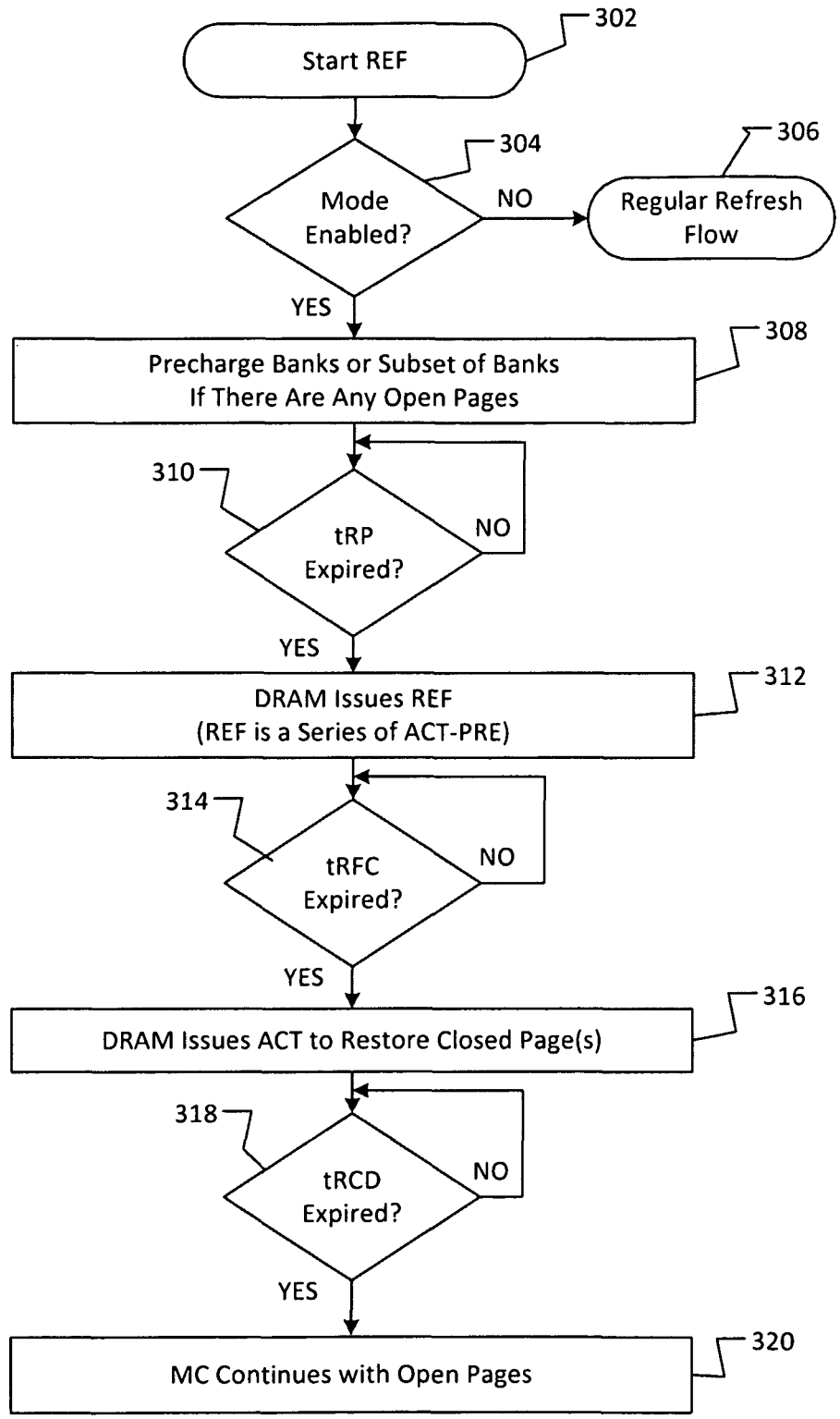
FIG. 3 is a flow chart to illustrate a process for page open memory refresh according to an embodiment.

FIG. 3 is a flow chart to illustrate a process for page open memory refresh according to an embodiment. In some embodiments, upon receiving a refresh command 302, if the page open refresh mode is not enabled 304, then a regular refresh flow (without page open refresh) is performed 306. If the page open refresh mode is enabled 304, then the DRAM issues a precharge of all or a subset of the banks of memory is performed if there are one or more open pages 308.

Upon expiration of the row precharge delay time (tRP) 310, the DRAM issues required commands for refresh of the contents of the memory banks, wherein the refresh is a series of activate and precharge operations for the memory 312.

Upon expiration of the refresh cycle time (tRFC) 314, the DRAM may issue an activate command to restore one or more closed pages 316.

Upon expiration of the row command delay time (tRCD) 318, the memory controller may then continue operations with the one or more open pages 320. In this manner, the memory controller has been able to cause completion of the memory refresh in conditions in which there are one or more memory pages open while freeing up command bandwidth because internal precharge, refresh, and activate commands are handled by the command logic of the DRAM memory.

Figure 4:
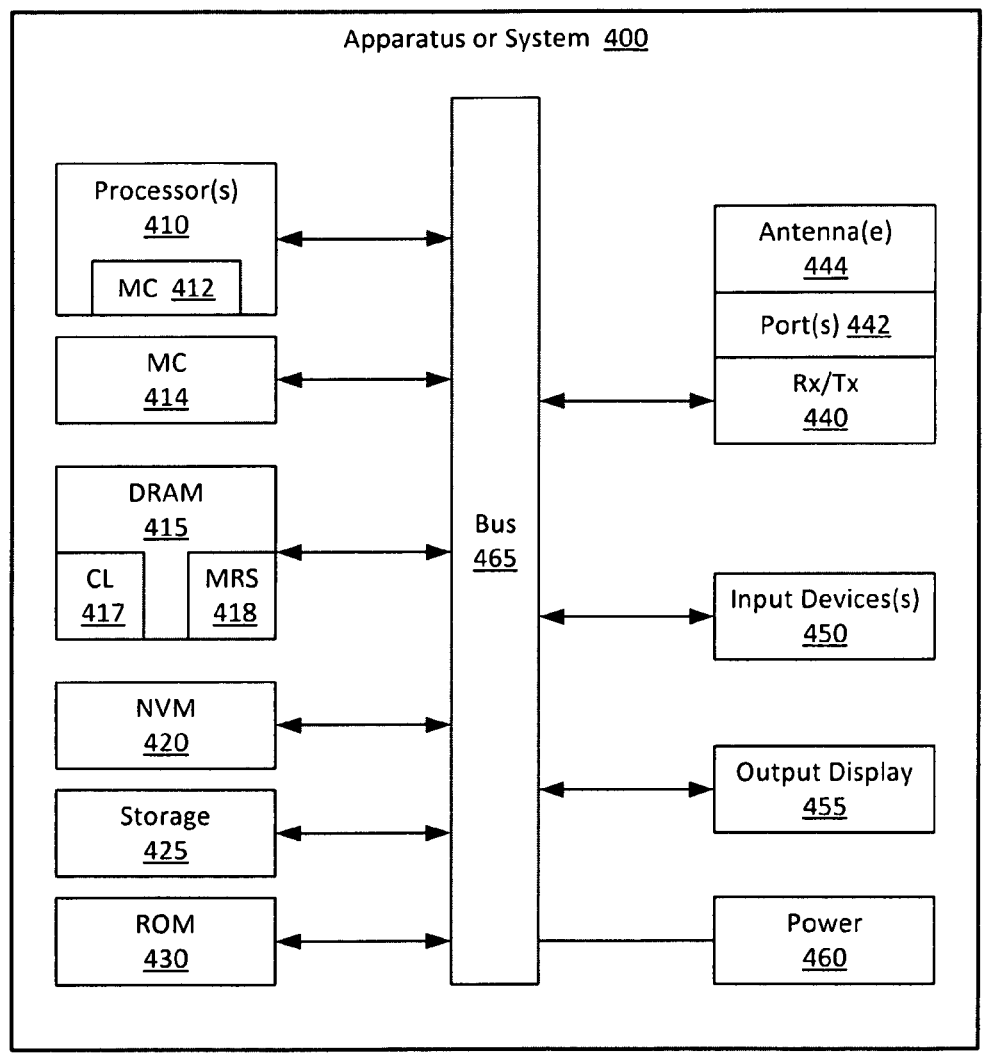
FIG. 4 is an illustration of an apparatus or system including a memory providing page open refresh according to an embodiment.

FIG. 4 is an illustration of an apparatus or system including a memory providing page open refresh according to an embodiment. In this illustration, certain standard and well-known components that are not germane to the present description are not shown. Elements shown as separate elements may be combined, including, for example, an SoC (System on Chip) combining multiple elements on a single chip. An apparatus or system 400 may include, but is not limited to, a mobile device.

In some embodiments, the apparatus or system 400 includes processing means (or processing units) such as one or more processors 410 coupled to one or more buses or interconnects, shown in general as bus 465. The processors 410 may comprise one or more physical processors and one or more logical processors. In some embodiments, the processors may include one or more general-purpose processors or special-processor processors. The bus 465 is a communication means for transmission of data. The bus 465 is illustrated as a single bus for simplicity, but may represent multiple different interconnects or buses and the component connections to such interconnects or buses may vary. The bus 465 shown in FIG. 4 is an abstraction that represents any one or more separate physical buses, point-to-point connections, or both connected by appropriate bridges, adapters, or controllers. In some embodiments, a processor 410 includes a memory controller 412 or operates with an external memory controller 414.

In some embodiments, the apparatus or system 400 further comprises a random access memory (RAM) or other dynamic storage device or element as a main memory for storing information and instructions to be executed by the processors 410. Main memory may include, but is not limited to, dynamic random access memory (DRAM) 415. The DRAM may include elements illustrated for DRAM 110 in FIG. 1. In some embodiments, the DRAM 415 includes control logic 417 to provide memory control operation and a mode register set 418 to provide for enabling or disabling certain modes. In some embodiments, the control logic 417 includes logic to perform memory refresh, including page open memory refresh. In some embodiments, the mode register set 418 includes a register to enable or disable a page open refresh mode.

In some embodiments, the memory controller 412-414 is operable to provide a write to the page open refresh mode register in the mode register set 418 to enable or disable the page open refresh mode. With the page open refresh mode enabled, the memory controller 412-414 is operable to provide a refresh command to the DRAM 415 with a memory page open, wherein the control logic 417 of the DRAM in response to perform internal precharge, refresh, and activate operations to perform the refresh cycle in response to the refresh command. The operations for the page open refresh may be as illustrated in FIGS. 2 and 3.

The apparatus or system 400 also may comprise a non-volatile memory (NVM) 420; a storage device such as a solid state drive (SSD) 425; and a read only memory (ROM) 430 or other static storage device for storing static information and instructions for the processors 410.

NVM 420 may include, for example, block addressable memory device, such as NAND or NOR technologies, phase change memory (PCM), three dimensional cross point memory, or other byte addressable nonvolatile memory devices, memory devices that use chalcogenide phase change material, resistive memory, nanowire memory, ferroelectric transistor random access memory (FeTRAM), flash memory such as solid state disk (SSD) NAND or NOR, multi-threshold level NAND flash memory, NOR flash memory, magnetoresistive random access memory (MRAM) memory that incorporates memristor technology, spin transfer torque (STT)-MRAM, or a combination of any of the above, or other memory.

In some embodiments, the apparatus or system 400 includes one or more transmitters or receivers 440 coupled to the bus 465 to provide wired or wireless communications. In some embodiments, the apparatus or system 400 may include one or more antennae 444, such as dipole or monopole antennae, for the transmission and reception of data via wireless communication using a wireless transmitter, receiver, or both, and one or more ports 442 for the transmission and reception of data via wired communications. Wireless communication includes, but is not limited to, Wi-Fi, Bluetooth™, near field communication, and other wireless communication standards.

In some embodiments, apparatus or system 400 includes one or more input devices 450 for the input of data, including hard and soft buttons, a joy stick, a mouse or other pointing device, a keyboard, voice command system, or gesture recognition system.

In some embodiments, the apparatus or system 400 includes an output display 455, where the display 455 may include a liquid crystal display (LCD) or any other display technology, for displaying information or content to a user. In some environments, the display 455 may include a touch-screen that is also utilized as at least a part of an input device 450. Output display 455 may further include audio output, including one or more speakers, audio output jacks, or other audio, and other output to the user.

The apparatus or system 400 may also comprise a battery or other power source 460, which may include a solar cell, a fuel cell, a charged capacitor, near field inductive coupling, power adapter, or other system or device for providing or generating power in the apparatus or system 400. The power provided by the power source 460 may be distributed as required to elements of the apparatus or system 400.

In the description above, for the purposes of explanation, numerous specific details are set forth in order to provide a thorough understanding of the described embodiments. It will be apparent, however, to one skilled in the art that embodiments may be practiced without some of these specific details. In other instances, well-known structures and devices are shown in block diagram form. There may be intermediate structure between illustrated components. The components described or illustrated herein may have additional inputs or outputs that are not illustrated or described.

Various embodiments may include various processes. These processes may be performed by hardware components or may be embodied in computer program or machine-executable instructions, which may be used to cause a general-purpose or special-purpose processor or logic circuits programmed with the instructions to perform the processes. Alternatively, the processes may be performed by a combination of hardware and software.

Portions of various embodiments may be provided as a computer program product, which may include a computer-readable medium having stored thereon computer program instructions, which may be used to program a computer (or other electronic devices) for execution by one or more processors to perform a process according to certain embodiments. The computer-readable medium may include, but is not limited to, magnetic disks, optical disks, compact disk read-only memory (CD-ROM), and magneto-optical disks, read-only memory (ROM), random access memory (RAM), erasable programmable read-only memory (EPROM), electrically-erasable programmable read-only memory (EEPROM), magnet or optical cards, flash memory, or other type of computer-readable medium suitable for storing electronic instructions. Moreover, embodiments may also be downloaded as a computer program product, wherein the program may be transferred from a remote computer to a requesting computer.

Many of the methods are described in their most basic form, but processes can be added to or deleted from any of the methods and information can be added or subtracted from any of the described messages without departing from the basic scope of the present embodiments. It will be apparent to those skilled in the art that many further modifications and adaptations can be made. The particular embodiments are not provided to limit the concept but to illustrate it. The scope of the embodiments is not to be determined by the specific examples provided above but only by the claims below.

If it is said that an element "A" is coupled to or with element "B," element A may be directly coupled to element B or be indirectly coupled through, for example, element C. When the specification or claims state that a component, feature, structure, process, or characteristic A "causes" a component, feature, structure, process, or characteristic B, it means that "A" is at least a partial cause of "B" but that there may also be at least one other component, feature, structure, process, or characteristic that assists in causing "B." If the specification indicates that a component, feature, structure, process, or characteristic "may", "might", or "could" be included, that particular component, feature, structure, process, or characteristic is not required to be included. If the specification or claim refers to "a" or "an" element, this does not mean there is only one of the described elements.

An embodiment is an implementation or example. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments, various features are sometimes grouped together in a single embodiment, figure, or description thereof for the purpose of streamlining the disclosure and aiding in the understanding of one or more of the various novel aspects. This method of disclosure, however, is not to be interpreted as reflecting an intention that the claimed embodiments requires more features than are expressly recited in each claim. Rather, as the following claims reflect, novel aspects lie in less than all features of a single foregoing disclosed embodiment. Thus, the claims are hereby expressly incorporated into this description, with each claim standing on its own as a separate embodiment.

In some embodiments, a memory device includes a memory array including a plurality of memory banks; and a control logic to provide control operations for the memory device including a page open refresh mode. The control logic is to perform a refresh cycle in response to a refresh command with a memory page of the memory array open, the refresh operation including precharge of one or more memory banks of the plurality of memory banks, refresh of the one or more memory banks, and activation of the memory page.

In some embodiments, a memory device further includes a mode register set including a mode register to enable or disable the page open refresh mode.

In some embodiments, the mode register for page open refresh mode is set in response to a received write command.

In some embodiments, the refresh command is one of a refresh command for all memory banks of the memory device or a refresh command for a specific memory bank of the memory device.

In some embodiments, the control logic is operable to perform the refresh cycle without receipt of a precharge command or an activate command.

In some embodiments, the memory device is a dynamic random access memory (DRAM) device. In some embodiments, the DRAM device is a double data rate (DDR) synchronous DRAM (SDRAM) memory device.

In some embodiments, a system includes one or more processors for processing of data; a memory controller for control of computer memory; a memory device for storage of data for the one or more processes; and a transmitter and receiver for transfer of data in wireless communications, the system including one or more antennae for data transmission. The memory device includes a memory array including a plurality of memory banks; and a control logic to provide control operations for the memory device including a page open refresh mode. The control logic is to perform a refresh cycle in response to a refresh command from the memory controller with a memory page of the memory array being open, the refresh operation including precharge of one or more memory banks of the plurality of memory banks, refresh of the one or more memory banks, and activation of the memory page.

In some embodiments, the memory device includes a mode register set including a mode register to enable or disable the page open refresh mode.

In some embodiments, the mode register for page open refresh mode is set in response to a received write command.

In some embodiments, the refresh command is one of a refresh command for all memory banks of the memory device or a refresh command for a specific memory bank of the memory device.

In some embodiments, the control logic of the memory device is operable to perform the refresh cycle without receipt of a precharge command or an activate command from the memory controller.

In some embodiments, a method includes receiving a refresh command at a memory device, wherein a memory page is open at a time of receipt of the refresh command; and performing a page open refresh by the memory device, the performance of the page open refresh including providing an internal precharge command for the memory device, precharging one of more memory banks of the memory device, providing an internal refresh command for the memory device, performing a refresh cycle for the one or more memory banks of the memory device, providing an internal activate command for the memory device, and reopening the one or more banks of the memory device.

In some embodiments, the method further includes reading a mode register for a page open refresh mode, the performance of the page open refresh being dependent on the mode register being enabled.

In some embodiments, the method further includes enabling or disabling the mode register in response to a received write command.

In some embodiments, the refresh command is one of a refresh command for all memory banks of the memory device or a refresh command for a specific memory bank of the memory device.

In some embodiments, the page open refresh is performed without receipt of a precharge command or an activate command by the memory device.

In some embodiments, a non-transitory computer-readable storage medium having stored thereon data representing sequences of instructions that, when executed by one or more processing units, cause the one or more processing units to perform operations including receiving a refresh command at a memory device, wherein a memory page is open at a time of receipt of the refresh command; and performing a page open refresh by the memory device, the performance of the page open refresh including providing an internal precharge command for the memory device, precharging one of more memory banks of the memory device, providing an internal refresh command for the memory device, performing a refresh cycle for the one or more memory banks of the memory device, providing an internal activate command for the memory device, and reopening the one or more banks of the memory device.

In some embodiments, the medium further include instructions for reading a mode register for a page open refresh mode, the performance of the page open refresh being dependent on the mode register being enabled.

In some embodiments, the medium further include instructions for enabling or disabling the mode register in response to a received write command.

In some embodiments, the refresh command is one of a refresh command for all memory banks of the memory device or a refresh command for a specific memory bank of the memory device.

In some embodiments, the page open refresh is performed without receipt of a precharge command or an activate command by the memory device.

In some embodiments, an apparatus includes means for receiving a refresh command at a memory device, wherein a memory page is open at a time of receipt of the refresh command; and means for performing a page open refresh by the memory device, the means for performing the page open refresh including means for providing an internal precharge command for the memory device, means for precharging one of more memory banks of the memory device, means for providing an internal refresh command for the memory device, means for performing a refresh cycle for the one or more memory banks of the memory device, means for providing an internal activate command for the memory device, and means for reopening the one or more banks of the memory device.

In some embodiments, the apparatus further includes means for reading a mode register for a page open refresh mode, the performance of the page open refresh being dependent on the mode register being enabled.

In some embodiments, the apparatus further includes means for enabling or disabling the mode register in response to a received write command.

In some embodiments, the refresh command is one of a refresh command for all memory banks of the memory device or a refresh command for a specific memory bank of the memory device.

In some embodiments, the page open refresh is performed without receipt of a precharge command or an activate command by the memory device.

What is claimed is:

1. A memory device comprising:
   a memory array including a plurality of memory banks; and
   a control logic to provide control operations for the memory device including a page open refresh mode;
   wherein the control logic is to perform a refresh cycle in response to a refresh command with a memory page of the memory array open, the refresh operation including:
      precharge of one or more memory banks of the plurality of memory banks,
      refresh of the one or more memory banks, and
      activation of the memory page.

2. The memory device of claim 1, further comprising a mode register set including a mode register to store an indication to enable or disable the page open refresh mode.

3. The memory device of claim 2, wherein the mode register for page open refresh mode is set in response to a received write command.

4. The memory device of claim 1, wherein the refresh command is one of a refresh command for all memory banks of the memory device or a refresh command for a specific memory bank of the memory device.

5. The memory device of claim 1, wherein the control logic is operable to perform the refresh cycle without receipt of a precharge command or an activate command.

6. The memory device of claim 1, wherein the memory device comprises a dynamic random access memory (DRAM) device.

7. The memory device of claim 6, wherein the DRAM device comprises a double data rate (DDR) synchronous DRAM (SDRAM) memory device.

* * * * *